United States Patent [19]
Balascio et al.

[11] Patent Number: 5,714,005
[45] Date of Patent: Feb. 3, 1998

[54] ST-CUT AND AT-CUT ORIENTED SEED BODIES FOR QUARTZ CRYSTAL SYNTHESIS AND METHOD FOR MAKING THE SAME

[75] Inventors: Joseph F. Balascio, Carlisle; Thien T. Nguyen, Mechanicsburg; David J. Weary, Carlisle, all of Pa.; Theodore E. Lind, Lombard, Ill.

[73] Assignee: Motorola Inc., Schaumburg, Ill.

[21] Appl. No.: 575,202

[22] Filed: Dec. 20, 1995

[51] Int. Cl.$^6$ ..................................... C30B 7/10
[52] U.S. Cl. ................ 117/72; 117/71; 117/902; 117/943; 423/335
[58] Field of Search .................. 117/71, 72, 902, 117/943; 423/335

[56] References Cited

U.S. PATENT DOCUMENTS

| | | | |
|---|---|---|---|
| H560 | 12/1988 | Gualteri | 117/943 |
| 2,574,257 | 11/1951 | Franklin | 117/943 |
| 2,871,192 | 1/1959 | Augustine et al. | 117/72 |
| 3,576,608 | 4/1971 | Gehres | 117/72 |
| 3,917,506 | 11/1975 | Lind et al. | 117/72 |
| 5,377,615 | 1/1995 | Detaint et al. | 117/1 |

*Primary Examiner*—Robert Kunemund
*Attorney, Agent, or Firm*—Brian M. Mancini

[57] ABSTRACT

ST-cut and AT-cut quartz seed bodies (18,40) for quartz crystal synthesis and method for making the same are disclosed. An extended quartz seed body (18) having an angle of about 42.75° rotated about a X axis (20) from a +Z axis (22) to a −Y axis (24) and defining a ST-cut is provided and a quartz crystal bar (32) is grown thereupon. Analogously, an extended quartz seed body (40) having an angle of about 35.25° rotated about a X axis (20) from a +Z axis (22) to a −Y axis (24) and defining an AT-cut is provided and a quartz crystal bar (48) is grown thereupon. In each case, the subsequent quartz crystal bar (32,48) may be wafered parallel to the seed body (18,40) thereby; reducing waste (68), recovering the seed body (18,40) for reuse, producing wafers (70) without intervening seed portions, and increasing factory capacity.

17 Claims, 4 Drawing Sheets

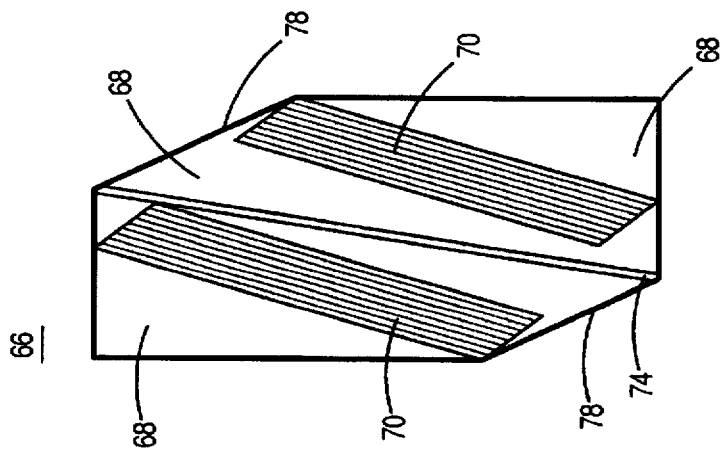
FIG.4C
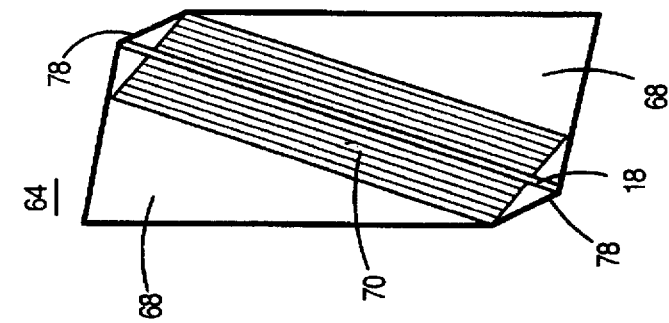
FIG.4B
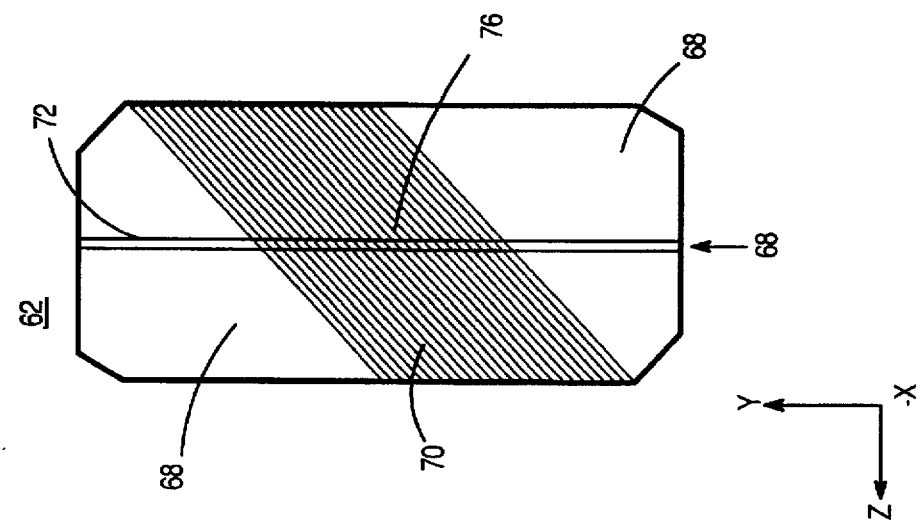
FIG.4A
FIG.5

ST-CUT AND AT-CUT ORIENTED SEED BODIES FOR QUARTZ CRYSTAL SYNTHESIS AND METHOD FOR MAKING THE SAME

FIELD OF THE INVENTION

The present invention relates generally to synthetically-grown single crystals and, in particular, to ST-cut and AT-cut oriented seed bodies for quartz crystal synthesis and method for making the same.

BACKGROUND OF THE INVENTION

Piezoelectric wafers have been used for many decades as frequency control elements in radio communication devices. Typically, individual piezoelectric wafers are fabricated from larger single crystal piezoelectric bars which have been grown synthetically in an autoclave. The general methods of growing piezoelectric bars are well known in the art, and typically include exposing a seed crystal, under high temperature and pressure, to a solution containing substantial quantities of a soluble alkali compound, such as sodium chloride, sodium carbonate, sodium bicarbonate, or sodium hydroxide. The solution is maintained in contact with a supply material of silica so that the solution becomes supersaturated with silica. Crystal growth takes place by the transfer of silica from the supply material, through the solution or fluid, to the quartz seed. Other methods have also been employed with success in which the crystal seed is exposed to other suitable predetermined chemical and physical environments which promote crystalline growth on the seed to produce a piezoelectric crystalline material bar from which individual crystal elements may be fabricated.

Those skilled in the art recognize that quartz is one of the types of crystals which primarily grow elongated in one direction, in the case of quartz, along the Z crystal axis. A fully grown quartz crystal, between its ends, tends to be in the shape of an elongated prism bounded by a set of six faces, known as the primary faces, which extend in the direction of natural elongation, or Z-axis, of the crystal. Typically, at either end the crystal is terminated by three intersecting faces, known as the major rhombohedral faces, which produce tapered end caps on the crystal. In addition, minor rhombohedral faces may be located between the major rhombohedral faces and the primary faces. There may appear additional faces of lessor proportions, but these are not important for the purposes of understanding the invention.

The rate of growth of each of the faces on a quartz bar differs dramatically. Generally, growth in the Z-direction is fastest, followed by the X-directions for synthetically grown bars, the minor rhombohedral faces, the major rhombohedral faces and lastly the primary faces. This growth rate differentiation becomes a major consideration for quartz crystal bar growth. Prior art efforts have grown bars from seeds that were perpendicular to the Z-axis or parallel to a minor rhombohedral face, with the expectation that faster growth results in a cheaper product. However, other pertinent factors such as waste and factory capacity have not been considered in this regard. For popular wafer angles, such as the AT-cut for bulk acoustic wave devices and the ST-cut for surface acoustic wave devices, there can be a considerable amount of waste involved in processing.

An important goal in the manufacture of quartz bars is to obtain maximum output from a factory. This may be accomplished through both increased yield and increased utilization of existing capacity. One approach to this problem has been to grow bars as fast as possible. However, this does not consider waste and capacity problems. Another approach has been to increase the size of wafers produced, thereby increasing the number of usable devices per crystal bar. However, this results in autoclave runs of relatively long duration, more waste, and requirements for more growth space in the autoclave. Another approach is to increase the number of factory autoclaves, but this incurs heavy capital costs.

There is a need for ST-cut and AT-cut quartz crystals that can be produced more quickly in existing facilities through more efficient utilization of materials and equipment and reduction in waste. In this regard, there is also a need to provide an efficient technique to regenerate seed stock for continued processing without diminishing production capacity. In addition, it is desirable to provide wafers as large as possible from a single crystal without those wafers containing a wasteful intervening seed portion.

BRIEF DESCRIPTION OF THE DRAWINGS

FIGS. 4a, 4b and 4c show a cross sectional view of quartz crystal bars grown in a pure-Z, ST-cut, and r-face configuration, respectively, each bar showing locations of a plurality of wafers produced therefrom, in accordance with the present invention; and FIG. 5 shows a block diagram for a method of producing quartz crystal bars from ST-cut and AT-cut seed bodies, in accordance with the present invention.

DETAILED DESCRIPTION OF THE PREFERRED EMBODIMENT

The present invention provides a significant improvement in the production of ST-cut and AT-cut quartz wafers in that large wafers can be provided without a wasteful intervening seed portion. A surprising and unexpected result of the technique used is that a significant improvement is obtained in the yield of quartz material usable for piezoelectric elements, both with respect to the time necessary for a run of quartz crystals, as well as with respect to available autoclave capacity for growing such crystals. Further, in the present invention it is no longer necessary to produce separate crystal bars for the fabrication of new seed bodies because each production crystal bar may return up to three usable seed bodies for subsequent production runs.

Certain orientations of wafers such as the ST and AT-cuts, when provided from crystals grown in the Z-direction (from Y-bar seed bodies) or from minor rhombohedral face crystals (r-face seed bodies), produce more waste and less yield since these types of crystals take up more room in an autoclave and produce lesser amounts of usable wafers, even though the crystal bars can be grown relatively quickly. Another limiting factor in the use of such crystals is the rapid development of the major rhomobohedral faces on crystals grown from r-face and Y-bar seed bodies. This causes a tapered shape at either end of the crystal and decreases the total crystal growth rate. In turn, this taper results in much of the crystal bar being unusable for producing wafers of satisfactory dimensions.

In the present invention, a significant improvement is obtained in the yield of quartz wafers from an autoclave run, not only with respect to the amount of waste from a crystal, but also with respect to the time of crystal growth and available autoclave space for growing such crystals.

In accordance with the present invention, the limitations on growth imposed by the primary faces and the major rhombohedral faces are avoided to a considerable extent by the use of a large area seed body whose major area faces are inclined at substantial angles to the primary and major rhombohedral faces. Preferably, the breadth of the seed body is chosen so that the total crystal growth in the direction of any edge of the seed body is considerably less than the original seed area dimension so as to control taper.

Figure 1:
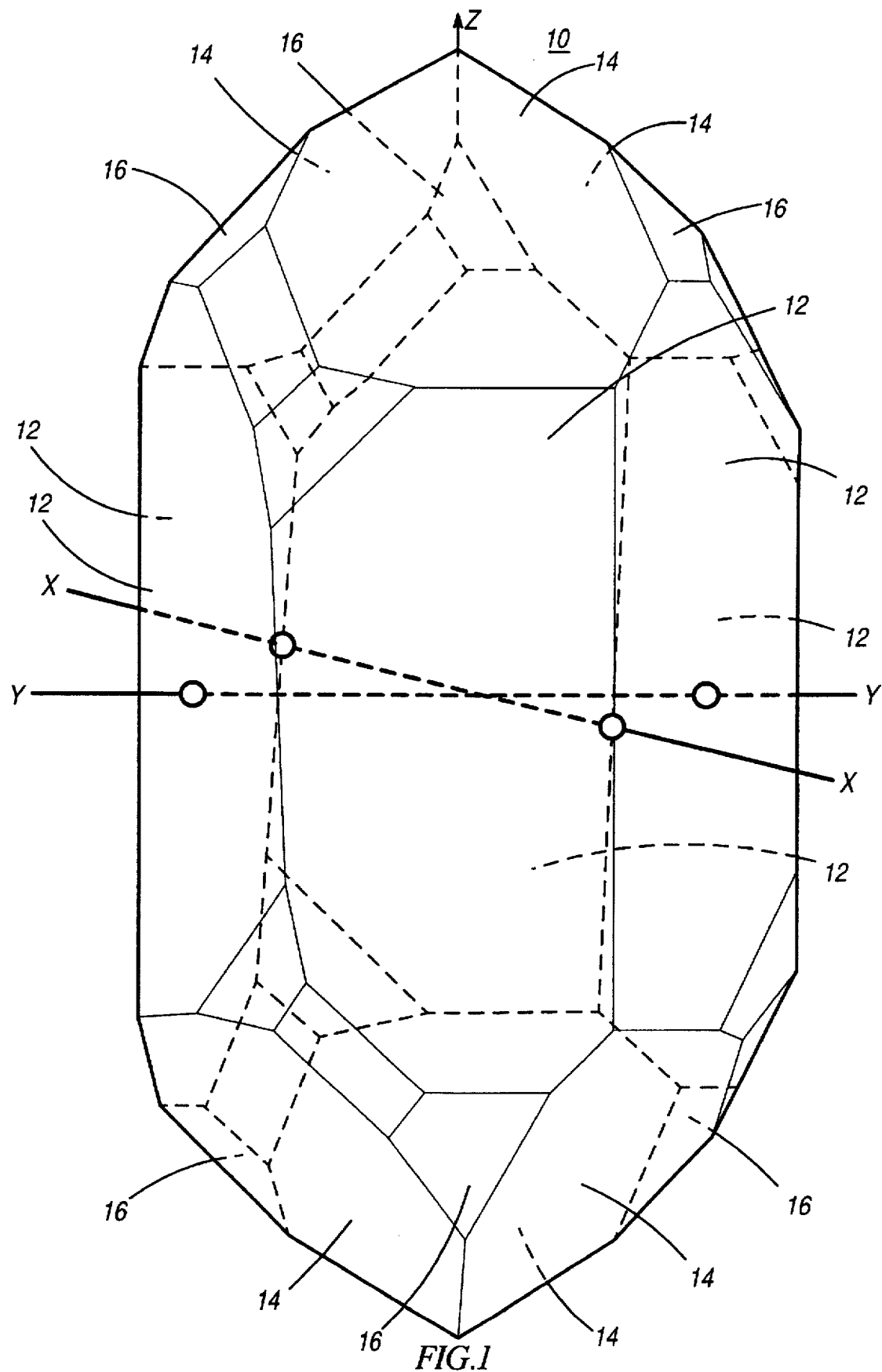
FIG. 1 shows a perspective view of an idealized natural single crystal of quartz of the left-hand variety.

Referring to FIG. 1, there is shown an idealized natural crystal 10 of left-handed quartz that is well known in the art. This crystal 10 is elongated in the direction of the crystallographic Z-axis. The crystal 10 is bounded around its middle by the six primary faces 12 characterized in crystallography by their Miller index $\{10\bar{1}0\}$. These primary faces 12 extend parallel to the crystallographic Z-axis, which is in the natural elongation of quartz and is sometimes referred to as the optical axis. Each primary face 12 is intersected by a pair of neighboring primary faces 12, each inclined 60° thereto. At each end of the quartz crystal 10, in the direction of the crystallographic Z-axis, there are three intersecting major rhombohedral faces 14 characterized in crystallography by their Miller index $\{01\bar{1}1\}$. Minor rhombohedral faces 16, having Miller index $\{10\bar{1}1\}$, are located between the major rhombohedral faces 14 and the primary faces 12. FIG. 1 shows certain additional faces, known as the trigonal bipyramid and trigonal trapezohedron faces, which sometimes occur in natural quartz crystals 10 but are not important for an understanding of the present invention.

Figure 2A:
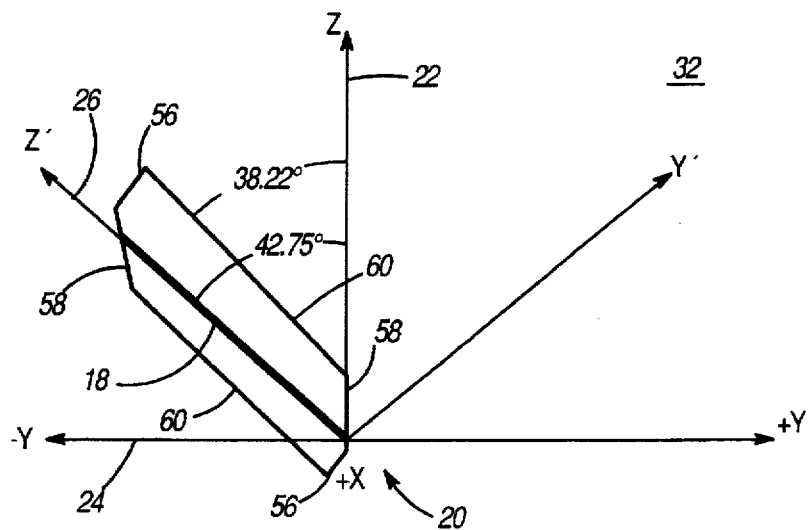
FIG. 2a shows a cross sectional view of a crystallographically oriented ST-cut seed body and a quartz crystal bar subsequently produced from the seed body, in accordance with the present invention.
Figure 2B:
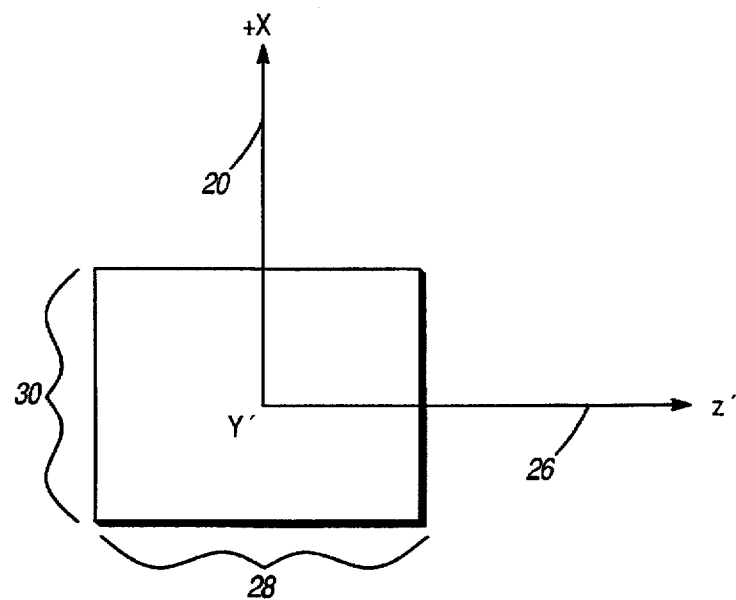
FIG. 2b and 2c show the top view of the ST-cut seed body and subsequently produced quartz crystal bar, respectively, in accordance with the present invention.

As shown in FIG. 2a, a seed body 18 for providing surface acoustic wave (SAW) devices is obtained from a quartz crystal bar (as represented in FIG. 1) inclined at an angle of about 39° to about 50° rotated about a X axis 20 from a +Z axis 22 towards a −Y axis 24. This holds true for both left and right-hand quartz. In a preferred embodiment, the seed body 18 is rotated about 42.75° defining a ST-cut plate having a length 28, as shown in FIG. 2b, extending substantially along a Z-prime axis 26 and a width 30 extending substantially along a crystallographic X axis 20. More particularly, the width 30 along the X axis 20 is chosen to be equal to or greater than a desired final wafer diameter.

As shown in FIGS. 2a and 2b, the seed body is extended and includes a predetermined length 28, width 30 and thickness sufficient to promote growth of a quartz crystal bar while providing a suitable integrity to withstand a harsh growth environment. In a preferred embodiment, the thickness of the seed body 18 is less than about two-thirds of the smaller of the seed body length 28 and width 30. More particularly, the thickness of the seed body 18 is about 0.1 to about 6 millimeters.

Figure 2C:
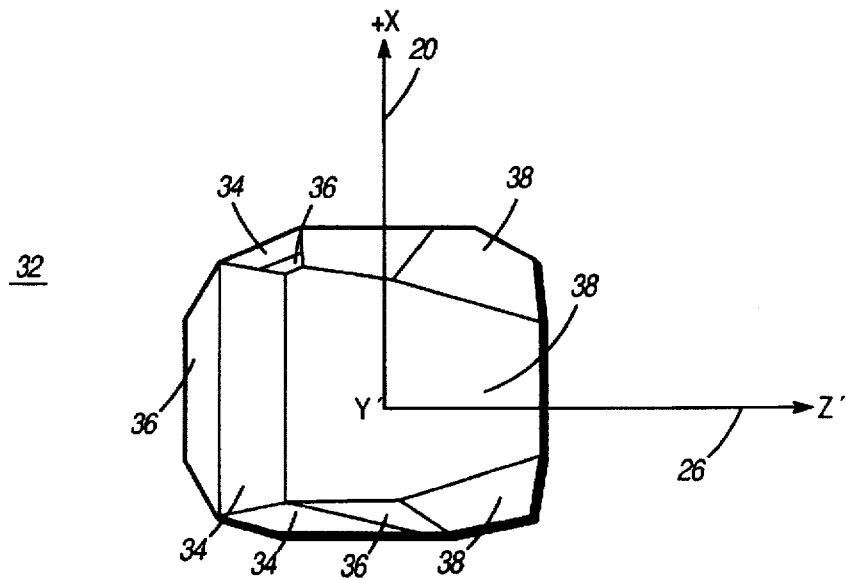

FIG. 2a shows a cross sectional view of a ST-cut quartz crystal bar 32 grown from the seed body 18 of FIG. 2b. FIG. 2c shows a top view of the quartz crystal bar 32, subsequently grown from the seed body 18 shown in FIG. 2b, with its primary faces 34, major rhomobohedral faces 36, and minor rhombohedral faces 38, corresponding to the primary faces 12, major rhombohedral faces 14, and minor rhomobohedral faces 16 of the natural quartz bar 10 shown in FIG. 1, respectively.

Figure 3A:
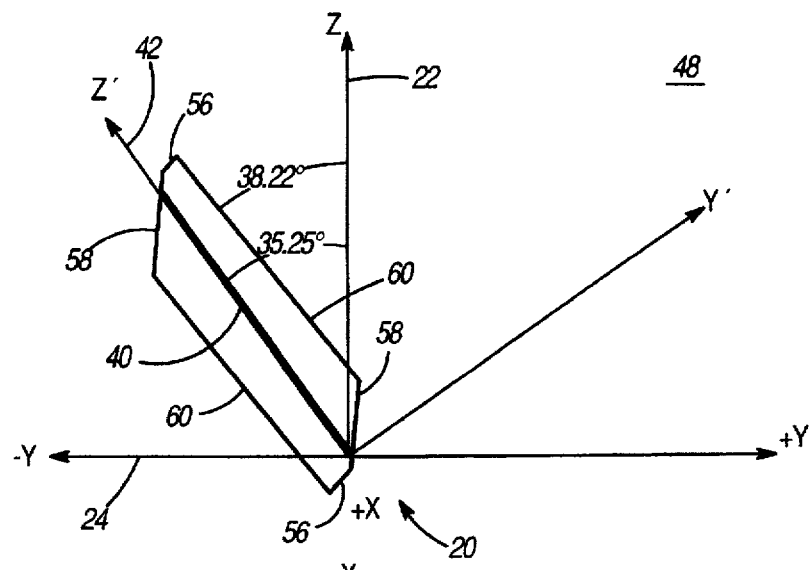
FIG. 3a shows a cross sectional view of a crystallographically oriented AT-cut seed body and a quartz crystal bar subsequently produced from the seed body, in accordance with the present invention.
Figure 3B:
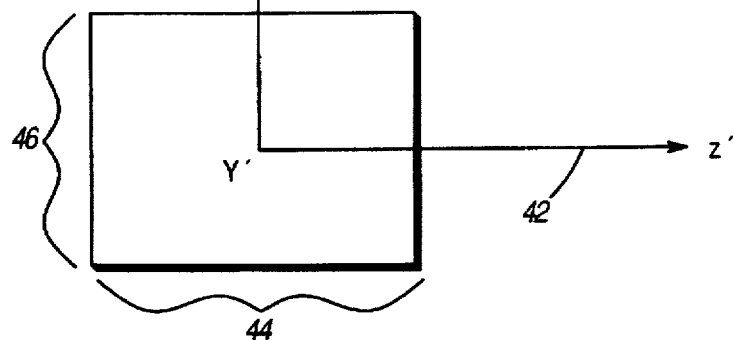
FIG. 3b and 3c show the top view of the AT-cut seed body and subsequently produced quartz crystal bar, respectively, in accordance with the present invention.

As shown in FIG. 3a, and in accordance with the present invention, a seed body 40 for providing bulk acoustic wave (BAW) devices is obtained from a quartz crystal bar (as represented in FIG. 1) inclined at an angle of about 22° to about 38° rotated about a X axis 20 from a +Z axis 22 towards a −Y axis 24. This holds true for both left and right-hand quartz. In a preferred embodiment, the seed body 40 is rotated about 35.25° defining an AT-cut plate having a length 44, as shown in FIG. 3b, extending substantially along a Z-prime axis 42 and a width 46 extending substantially along a crystallographic X axis 20. More particularly, the width 46 along the X axis 20 is chosen to be equal to or greater than a desired final wafer diameter.

As shown in FIGS. 3a and 3b, the seed body 40 is extended and includes a predetermined length 44, width 46 and thickness sufficient to promote growth of a quartz crystal bar 48 while providing a suitable integrity to withstand a harsh growth environment. In a preferred embodiment, the thickness of the seed body 40 is less than about two-thirds of the smaller of the seed body length 44 and width 46. More particularly, the thickness of the seed body 40 is about 0.1 to about 6 millimeters.

Figure 3C:
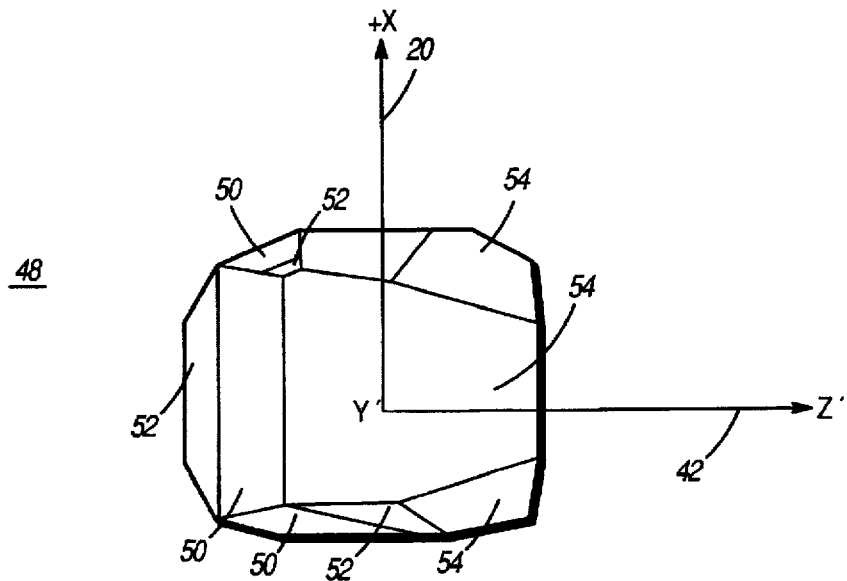

FIG. 3a shows a cross sectional view of an AT-cut quartz crystal bar 48 grown from the seed body 40 of FIG. 3a. FIG. 3c shows a top view of the quartz crystal bar 48, subsequently grown from the seed body 40 shown in FIG. 3a, with its primary faces 50, major rhomobohedral faces 52, and minor rhombohedral faces 54, corresponding to the primary faces 12, major rhombohedral faces 14, and minor rhomobohedral faces 16 of the natural quartz bar 10 shown in FIG. 1, respectively.

From FIGS. 2a and 3a, it can be seen that the quartz bar 32,48 has opposite end faces 56, tapered faces 58, and planar faces 60, corresponding to the primary faces 12, major rhombohedral faces 14, and minor rhomobohedral faces 16 of the natural quartz bar 10 shown in FIG. 1. Due to the inherent growth habit of quartz onto a seed body in a supersaturated medium, very rapid growth will take place in the direction of the crystallographic Z axis 22, and no significant growth will take place on the tapered primary faces 58. The growth in the Z direction will take place substantially equally on opposite sides of the bar 60. Since there is no significant growth on the primary faces 58, the area of the faces 58 will extend in the Z direction and define a boundary for the Y dimensions of the bar 32,48. As a result of the growth, the end faces 56 become larger in area and the planar faces 60 become smaller in area, further limiting the external dimensions of the bar.

As shown in FIGS. 2c and 3c, three primary faces 34,50 are seen on the left end of the bar 32,48, the faces 34,50 being inclined 60° to each other. Extending downward from the leftmost primary face is a major rhomobohedral face 36,52. A minor rhombohedral face 38,54 defines a largest center portion of the bar surface. At the right end of the bar, two minor rhombohedral faces 38,54 define each corner of the bar. There are other facets on the bar 32,48 that are not important in the understanding of the invention. However, it should be recognized that the growth of quartz bars is asymmetric in the −X and +X directions due to the polar nature of quartz and depending on whether left or right-hand quartz is used. This should be taken into account when optimizing seed body placement in an autoclave. Generally, a bottom view (not shown) of the bar 32,48 presents similar faces and geometries as described above. The primary faces 34,50, upper right and lower right minor rhombohedral faces 38,54 converge towards the center and to the right during the growth of the bar, thereby slightly reducing the area of the minor rhomobohedral face 38,54.

FIGS. 4a, 4b, and 4c show cross sectional views, along the −X axis, of quartz crystal bars of pure-Z 62, ST-cut 64, and r-face 66 configurations, respectively. As can be seen in FIG. 4a, the pure-Z crystal bar 62 produces a considerable amount of waste 68, and full-width ST-cut wafers 70 obtained from the pure-Z crystal bar 62 contain some of the original seed body 72 within their middle portions 76. It should be recognized that impurities and discontinuities at the seed body interface in the middle portions 76 would ultimately produce inferior devices. Therefore, the middle portions 76 are considered waste 68. Also, it should be recognized that the original seed body 72 is destroyed during wafering and cannot be recovered. In order to avoid the seed body 72, it is possible to produce half-width ST-cut wafers. However, this requires extra processing, and may not be desirable for an end user.

As can be seen in FIG. 4c, the r-face crystal bar 66 can produce ST-cut wafers 70 without intervening seed portions, but the r-face crystal bar 66 contains three zones of waste 68. Also, the substantial amount of taper 78 present from the primary faces necessitates the growth of a larger crystal 66 in order to obtain final wafers of a desired diameter. In addition, the recovery of the original seed body 74 requires a separate cutting process, or a special autoclave run to produce new seed bodies 74.

The ST-cut crystal bar 64, as shown in FIG. 4b, has the advantage of producing less waste 68 than either the pure-Z 62 or the r-face crystal bars 66. Further, the original seed body 18 is automatically recoverable during wafering, and less total crystal bar size is needed to produce final ST-cut wafers 70 of a desired diameter, due to the smaller taper 78 from the primary faces. Advantageously, this results in the ability to better utilize existing autoclave capacity and improve factory output without any new expenditures.

FIG. 5 shows a block diagram for a method 100 of growing quartz crystal bars from AT-cut and ST-cut seed bodies. This method includes providing 102 an extended AT or ST-cut seed body from a mother crystal and exposing 104 the seed body to a predetermined chemical and physical environment which promotes crystal growth on the seed body by deposition of quartz from the transfer medium in which a supersaturation of silica is maintained to cause crystalline growth on the seed body. Preferably, the transfer medium is an alkaline aqueous solution in contact with a supply of silica, preferably crystalline quartz, and the quartz seed body is exposed to this solution under conditions of elevated temperature and pressure which maintains a supersaturation of silica around the seed body to cause crystal growth on the seed body. The process of growing quartz crystals in a supersaturated silica solution is well known in the art. The seed body is supported by a suitable hanger arrangement (not shown) in an autoclave whereby subsequent growth of the crystal bar is not confined.

COMPARATIVE EXAMPLE A

The following experimental results serve to give an illustration of the practice of this invention, and are not intended in any way to limit the scope of this invention.

An experiment was conducted to determine the most efficient and practical method to produce quartz for surface acoustic wave (SAW) applications. Although SAW wafers have been successfully produced in 2", 3" and 4" diameters, in accordance with the invention, this experiment concentrated on 3" diameter ST-cut SAW wafers of about 0.023" thickness having an angle of about 42.75° rotated about the X axis from the +Z axis to the −Y axis. This holds true for both left and right-hand quartz. The experiments were primarily conducted in 10" by 15' autoclave vessels using processes that are well known in the art.

Three groups of seed bodies were provided, through conventional methods, wherein each group was selected to have angles, rotated about the X axis from the +Z axis to the −Y axis, of about, 38.22 degrees (parallel to an minor rhombohedral r-face), 42.75 degrees (ST-cut), and 90.00 degrees (Y-bar seed perpendicular to Z-axis). It should be noted that the X-dimension of the seed bodies should be equal to or exceed the desired diameter of the final wafer. To produce 3" wafers, seed bodies were utilized having an X-dimensions from about 3" up to about 3.3" and Z' dimensions from about 3.75" to about 4". The three groups of seed bodies were utilized in several autoclave runs conducted for each group of seed bodies.

It is well known in the art that as the rotation about the X axis is made more perpendicular to the Z axis, the typical average growth rate perpendicular to the seed body increases and the degree of taper of the stone decreases. However, it was unexpectedly found that the growth rate in the desired plane of fabrication is considerably greater for the ST-cut seed body than for the r-face seed body. This indicates that less time is needed to complete an autoclave run of crystals grown from ST-cut seed bodies than from r-face seed bodies. The second important feature of the ST-cut growth is that the degree of taper is less than for the r-face growth. This indicates that a stone grown from a ST-cut seed body produces less waste than a stone grown from r-face seed bodies.

It was also found that the original seed body could be recovered from the stone in addition to at least two more adjacent wafers of the same dimensions that could be used as seed bodies. This eliminates the need for additional seed runs to replenish production supplies.

Table 1 shows the summarized results from several experimental runs using seed bodies of the three indicated angles. As a result of taper, which was discussed above, it was necessary to utilize ST-cut and r-face seed bodies having dimensions larger than the desired production wafer dimensions. As a result of the efficient growth patterns, the stones produced from ST-cut seed bodies could be packed more tightly into the autoclave (180 stones per load) and needed less time to complete their growth (50 days), than was required by either the pure-Z stones or the r-face stones.

As shown in Table 2, the tighter packing ultimately provides for greater total wafer output than either the r-face or pure-Z grown stones, even though the ST-cut stone yielded only 13 wafers per stone. However, there is an additional benefit, in that, the ST-cut stone provides wafers with no intervening seed, whereas wafers produced from pure-Z stones all contain portions of the original seed body. It should be noted that the wafer yield for the r-face grown stone has been estimated.

TABLE 1

Actual results for 3" stones from 10" × 15' autoclave loads.

| Stone | Angle | Capacity | Time |
|---|---|---|---|
| r-face | 38.22° | 135 stones/load | 60 days/load |
| ST-seed | 42.75° | 180 stones/load | 50 days/load |
| Pure-Z | 90.00° | 32 stones/load | 89 days/load |

TABLE 2

Number and rate of 3" wafers obtained from above stones.

| Stone | Angle | Utilization | Rate |
|---|---|---|---|
| r-face | 38.22° | 13 wafers/stone | 29 wafers/day (est.) |
| ST-seed | 42.75° | 13 wafers/stone | 47 wafers/day |
| Pure-Z | 90.00° | 47 wafers/stone | 17 wafers/day |

As can be seen in Table 2, the yield of ST-cut 3" wafers produced from a quartz stone grown from a ST-cut seed is surprisingly higher, at 47 wafers per day, than the prior art methods of using r-face or pure-Z quartz bars. This would reduce ultimate ST-cut wafer cost.

COMPARATIVE EXAMPLE B

In addition to the ST-cut wafer experiment conducted above, a test was done to produce AT-cut stones from AT-cut seed bodies. These stones were successfully grown as shown in FIGS. 3a–3c. AT-cut quartz wafers are used for bulk acoustic wave (BAW) applications and are typically provided from pure-Z stones grown from a Y-bar seed body. In accordance with the invention, this test provided 2" AT-cut seed bodies upon which quartz was grown. Typically, 2" AT-cut wafers are provided having a thickness of about 0.008" and an angle of about 35.25° rotated about the X axis from the +Z axis to the −Y axis. This holds true for both left and right-hand quartz. Due to the 0.008" thickness, more AT-cut wafers per stone are available than for 0.023" thick ST-cut wafers. Therefore, the total yield and utilization may be improved. The AT-cut stones were grown in a 10" by 15' autoclave vessels using processes that are well known in the art.

The resulting AT-cut stones were similar in geometry to the ST-cut stones reported above, and analogous advantages should result for the AT-cut wafers produced from these stones. No wafers were actually cut from these first experimental stones. However, several observations can be drawn from the growth of the stones themselves. Since the stone is grown from an AT-cut seed body, the seed is recoverable during wafering, eliminating the need for additional seed runs to replenish production supplies, and there would be less waste than from a pure-Z grown stone. Since there would be less waste, the size of the AT-cut stone could be smaller resulting in a shorter growth period and increased autoclave utilization. This indicates that less time is needed to complete an autoclave run of crystals grown from AT-cut seed bodies than from a pure-Z stone.

Table 3 shows the estimated the stone growth available for AT-cut stones in comparison to actual growth of production pure-Z stones. As a result of the efficient growth patterns, the stones produced from AT-cut seed bodies could be packed more tightly into the autoclave (135 stones per load) and needed less time to complete their growth (60 days) than is presently required by pure-Z stones (generally 44 stones per load for 97 days).

As shown in Table 4, tighter packing would ultimately provide for greater total wafer output than for the pure-Z grown stones. Also, there is an additional benefit, in that, the AT-cut stone provides wafers with no intervening seed, whereas wafers produced from pure-Z stones all contain portions of an original seed body. It should be noted that the wafer yield for AT-cut grown stones has been estimated in comparison to actual pure-Z stone production data.

TABLE 3

Results for 2" stones from 10" × 15' autoclave loads.

| Stone | Angle | Capacity | Time |
|---|---|---|---|
| AT-seed | 35.25° | 135 stones/load | 60 days/load (est.) |
| Pure-Z | 90.00° | 44 stones/load | 97 days/load (act.) |

TABLE 4

Number and rate of 0.008" wafers obtained from above stones.

| Stone | Angle | Utilization | Rate |
|---|---|---|---|
| AT-seed | 35.25° | 35 wafers/stone | 79 wafers/day (est.) |
| Pure-Z | 90.00° | 140 wafers/stone | 64 wafers/day (act.) |

As can be seen in Table 4, the yield of AT-cut 2" wafers produced from a quartz stone grown from a AT-cut seed is estimated to be higher than the prior art methods of using pure-Z quartz bars. This would reduce ultimate wafer cost.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A seed body for promoting rapid crystalline growth of a quartz bar in a crystalline solution and for providing seedless quartz wafers of a desired X-axis dimension and a desired Z-prime axis dimension, comprising:

a plate cut from a quartz crystal bar at an angle of about 39° to about 55° rotated about a X axis from a +Z axis towards a −Y axis and defining a Z-prime axis, the plate having a width along the X-axis that is about equal to or greater than the desired X-axis dimension.

2. The seed body of claim 1, wherein the plate includes a length along the Z-prime axis that is greater than the desired Z-prime axis dimension.

3. The seed body of claim 2, wherein the width along the X-axis is about equal to the desired X-axis dimension and the length along the Z-prime axis is about one-and-one-quarter times the desired Z-prime axis dimension.

4. The seed body of claim 1, wherein the seed body includes a plate cut at an angle of about 42.75° rotated about a X axis from a +Z axis to a −Y axis defining a ST-cut crystal.

5. A seed body for promoting rapid crystalline growth of a quartz bar in a crystalline solution and for providing seedless a quartz wafers of a desired X-axis dimension and a desired Z-prime axis dimension, comprising:

a plate cut from a quartz crystal bar at an angle of about 22° to about 38° rotated about a X axis from a +Z axis towards a −Y axis and defining a Z-prime axis, the plate having a width along the X-axis that is about equal to or greater than the desired X-axis dimension.

6. The seed body of claim 1, wherein the plate includes a length along the Z-prime axis that is greater than the desired Z-prime axis dimension.

7. The seed body of claim 6, wherein the width along the X-axis is about equal to the desired X-axis dimension and the length along the Z-prime axis is about one-and-one-quarter times the desired Z-prime axis dimension.

8. The seed body of claim 5, wherein the seed body includes a plate cut at an angle of about 35.25° rotated about a X axis from a +Z axis to a −Y axis defining an AT-cut crystal.

9. A quartz crystal bar for providing seedless quartz wafers of a desired X-axis dimension and a desired Z-prime axis dimension with minimal waste, comprising:

an extended quartz seed body having a crystallographic angle rotated about a X axis from a +Z axis towards a −Y axis and defining a Z-prime axis, a length of the seed body extending substantially along a predetermined Z-prime axis and a width of the seed body extending substantially along a crystallographic X axis, the seed body being of the same crystallographic orientation as a plurality of wafers subsequently sectioned from the quartz crystal bar, wafers subsequently sectioned from the quartz crystal bar being substantially parallel to the seed body;

the length of the seed body being greater than the desired Z-prime axis dimension and a width of the seed body being about equal to or greater than the desired X-axis dimension such that the quartz bar provides an equal or greater number of usable quartz wafers than an equivalently sized quartz bar grown from an r-face seed body and pure-Z crystal; and quartz crystal disposed onto the seed body such that tapered surfaces, as grown from edges of the seed body that are parallel to the X-axis, converge to not less than the desired Z-prime axis dimension until substantially distant from the seed body.

10. The quartz crystal bar of claim 9, wherein the seed body includes a crystallographic orientation having the Z-prime axis at an angle of about 39° to about 55° rotated about a X axis from a +Z axis towards a −Y axis.

11. The quartz crystal bar of claim 10, wherein the seed body includes a crystallographic orientation having the Z-prime axis at an angle of about 42.75° rotated about a X axis from a +Z axis towards a −Y axis defining a ST-cut seed body, and the width along the X-axis is about equal to the desired X-axis dimension and the length along the Z-prime axis is about one-and-one-quarter times the desired Z-prime axis dimension.

12. The quartz crystal bar of claim 9, wherein the seed body includes a crystallographic orientation having the Z-prime axis at an angle of about 22° to about 38° rotated about a X axis from a +Z axis towards a −Y axis.

13. The quartz crystal bar of claim 12, wherein the seed body includes a crystallographic orientation having the Z-prime axis at an angle of about 35.25° rotated about a X axis from a +Z axis towards a −Y axis defining an AT-cut seed body, and the width along the X-axis is about equal to the desired X-axis dimension and the length along the Z-prime axis is about one-and-one-quarter times the desired Z-prime axis dimension.

14. A method of growing a quartz crystal bar for providing seedless quartz wafers of a desired X-axis dimension and a desired Z-prime axis dimension in an environment which promotes quartz crystal growth, comprising:

providing an extended quartz seed body having an angle of about 39° to about 55° rotated about a X axis from a +Z axis towards a −Y axis defining a Z-prime axis, the seed body having a length along the Z-prime axis that is greater than the desired Z-prime axis dimension and a width along the X-axis that is about equal to or greater than the desired X-axis dimension; and exposing the seed body to a fluid medium adapted to provide supersaturation of silica in proximity to the seed body to cause crystal growth on the seed body such that tapered surfaces, as grown from edges of the seed body that are parallel to the X-axis, converge to not less than the desired Z-prime axis dimension until substantially distant from the seed body.

15. The method of claim 14, wherein the providing step includes a seed body with a crystallographic orientation having the Z-prime axis at an angle of about 42.75° rotated about a X axis from a +Z axis towards a −Y axis defining a ST-cut seed body, and the width along the X-axis is about equal to the desired X-axis dimension and the length along the Z-prime axis is about one-and-one-quarter times the desired Z-prime axis dimension.

16. A method of growing a quartz crystal bar for providing seedless quartz wafers of a desired X-axis dimension and a desired Z-prime axis dimension in an environment which promotes quartz crystal growth, comprising:

providing an extended quartz seed body having an angle of about 22° to about 38° rotated about a X axis from a +Z axis towards a −Y axis defining a Z-prime axis, the seed body having a length along the Z-prime axis that is greater than the desired Z-prime axis dimension and a width along the X-axis that is about equal to or greater than the desired X-axis dimension; and exposing the seed body to a fluid medium adapted to provide supersaturation of silica in proximity to the seed body to cause crystal growth on the seed body such that tapered surfaces, as grown from edges of the seed body that are parallel to the X-axis, converge to not less than the desired Z-prime axis dimension until substantially distant from the seed body.

17. The method of claim 16, wherein the providing step includes a seed body with a crystallographic orientation having the Z-prime axis at an angle of about 35.25° rotated about a X axis from a +Z axis towards a −Y axis defining an AT-cut seed body, and the width along the X-axis is about equal to the desired X-axis dimension and the length along the Z-prime axis is about one-and-one-quarter times the desired Z-prime axis dimension.

* * * * *

UNITED STATES PATENT AND TRADEMARK OFFICE
CERTIFICATE OF CORRECTION

PATENT NO. : 5,714,005
DATED : February 3, 1998
INVENTOR(S) : Balascio et al.

It is certified that error appears in the above-indentified patent and that said Letters Patent is hereby corrected as shown below:

Column 8, line 46 reads "egual" should be -- equal --.

Column 8, line 61, reads "seedless a quartz wafers" should be -- seedless quartz wafers --.

Column 9, line 1 reads "claim 1" should be -- claim 5 --.

Signed and Sealed this

Twenty-first Day of July, 1998

Attest:

BRUCE LEHMAN

Attesting Officer

Commissioner of Patents and Trademarks